United States Patent
Yamada et al.

(10) Patent No.: US 7,901,149 B2
(45) Date of Patent: Mar. 8, 2011

(54) SUBSTRATE PROCESSING METHOD, PROGRAM, COMPUTER-READABLE RECORDING MEDIUM, AND SUBSTRATE PROCESSING SYSTEM

(75) Inventors: Yoshiaki Yamada, Koshi (JP); Tadayuki Yamaguchi, Minato-ku (JP); Yuuichi Yamamoto, Minato-ku (JP); Yasuhito Saiga, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 12/307,936

(22) PCT Filed: Jul. 19, 2007

(86) PCT No.: PCT/JP2007/064620
§ 371 (c)(1),
(2), (4) Date: Jan. 8, 2009

(87) PCT Pub. No.: WO2008/013211
PCT Pub. Date: Jan. 31, 2008

(65) Prior Publication Data
US 2009/0208879 A1  Aug. 20, 2009

(30) Foreign Application Priority Data
Jul. 26, 2006 (JP) ................................. 2006-203066

(51) Int. Cl.
*G03B 13/00* (2006.01)
*G03D 5/00* (2006.01)
(52) U.S. Cl. ........................................ 396/611; 396/576
(58) Field of Classification Search .................. 396/576, 396/611
See application file for complete search history.

(56) References Cited

U.S. PATENT DOCUMENTS

| | | | |
|---|---|---|---|
| 2002/0009902 A1 | 1/2002 | Hashiguchi et al. | |
| 2002/0014600 A1 | 2/2002 | Sato et al. | |
| 2003/0003774 A1 | 1/2003 | Hashiguchi et al. | |
| 2004/0101790 A1* | 5/2004 | Cauchi et al. | 430/394 |
| 2005/0162627 A1 | 7/2005 | Finders et al. | |
| 2006/0160028 A1* | 7/2006 | Lee et al. | 430/312 |
| 2007/0172234 A1* | 7/2007 | Shigemori et al. | 396/611 |
| 2007/0212654 A1* | 9/2007 | Larson et al. | 430/322 |

FOREIGN PATENT DOCUMENTS

| | | |
|---|---|---|
| JP | 7 147219 | 6/1995 |
| JP | 11 199830 | 7/1999 |
| JP | 2002 21763 | 1/2002 |
| JP | 2002 43214 | 2/2002 |
| JP | 2002 57200 | 2/2002 |
| JP | 2005 223321 | 8/2005 |
| JP | 2006 49757 | 2/2006 |
| JP | 2006 80489 | 3/2006 |
| WO | 2006-016489 | 2/2006 |

\* cited by examiner

*Primary Examiner* — Rodney E Fuller
(74) *Attorney, Agent, or Firm* — Oblon, Spivak, McClelland, Maier & Neustadt, L.L.P.

(57) ABSTRACT

A substrate on which a resist film has been formed is transferred to an aligner and subjected to exposure processing. The substrate is then subjected to post-exposure baking in a second processing system. The substrate is then transferred again to the aligner and subjected to exposure processing. The substrate for which exposure processing for the second time has been finished is transferred to a first processing system and again subjected to post-exposure baking. The time periods from the ends of the exposure processing to the starts of the post-exposure baking for the first time and the second time are controlled to be equal. In pattern forming processing in which exposure processing is performed a plurality of times between the resist film forming processing and the developing treatment, a pattern with a desired dimension can be finally formed.

14 Claims, 12 Drawing Sheets

SUBSTRATE PROCESSING METHOD, PROGRAM, COMPUTER-READABLE RECORDING MEDIUM, AND SUBSTRATE PROCESSING SYSTEM

TECHNICAL FIELD

The present invention relates to a substrate processing method, a program, a computer-readable recording medium, and a substrate processing system.

BACKGROUND ART

In a photolithography process in processing of manufacturing, for example, a semiconductor device, for example, a resist coating treatment of applying a resist solution onto a wafer surface to form a resist film, exposure processing of applying light in a predetermined pattern to the resist film on the wafer surface to expose the resist film, heating processing of heating the wafer to accelerate the chemical reaction in the exposed resist film (post-exposure baking), developing treatment of developing the wafer which has been subjected to the heating processing and the like are performed in sequence to form a predetermined pattern in the resist film on the wafer surface.

Incidentally, for miniaturization of the pattern, the light for the above exposure processing is increasingly shortened in wavelength. In the method of shortening the wavelength for exposure, however, it is technically difficult to form a fine pattern at a level of 32 nm or 45 nm. Hence, it is proposed to form a fine pattern by performing exposure a plurality of times with the exposure location being shifted, for example, with respect to the resist film in the exposure processing (see Patent Documents 1 and 2).

[Patent Document 1]
  Japanese Patent Application Laid-open No. 2002-21763
[Patent Document 2]
  Japanese Patent Application Laid-open No. H7-147219

DISCLOSURE OF THE INVENTION

[Problems to be Solved by the Invention]

In this case, however, since exposure processing is performed a plurality of times in sequence and post-exposure baking that is the processing subsequent thereto is then performed after the plurality of times of the exposure processing is finished, a large difference in time period to the start of post-exposure baking is made between, for example, an exposed portion which has been exposed by the exposure processing for the first time and an exposed portion which has been exposed by the exposure processing for the second time. Because the time period from the end of the exposure to the start of the post-exposure baking greatly affects the dimension of the pattern to be finally formed, in the above case, the dimension of the pattern varies for each exposed portion by each exposure processing and the consistency between the dimensions of the exposed portions by the exposure processing is not ensured. As a result, a pattern in a desired shape is not finally formed on the wafer.

The present invention has been developed in consideration of the above viewpoints and its object is to finally form a pattern in a desired shape on a substrate such as a wafer when performing exposure processing a plurality of times.

[Means for Solving the Problems]

To attain the above object, the present invention is a substrate processing method wherein exposure processing performed between processing of forming a resist film and developing treatment is performed a plurality of times, and substrate heating processing is performed every time each exposure processing is finished.

According to the present invention, since substrate heating processing is performed every time exposure processing is performed, the difference in time period from the end of the exposure processing to the start of the post-exposure baking between each time is reduced. As a result, the dimension of the pattern of the exposed portion by each exposure processing becomes stable and the consistency between the dimensions of the exposed portions by the exposure processing is improved, so that a pattern in a desired shape can be finally formed.

Time periods from ends of the exposure processing to starts of the heating processing may be controlled to be equal to each other.

A different exposure condition may be set for each exposure processing. In this case, the exposure conditions of the exposure processing for a second time and subsequent times may be set to be less in exposure amount than that of the exposure processing for an immediately preceding time.

A different heating condition may be set for every heating processing after each exposure processing. In this case, the heating conditions of the heating processing for a second time and subsequent times may be set to be shorter in heating time and/or lower in heating temperature than those of the heating processing for an immediately preceding time.

The exposure processing may be for transmitting light through a liquid on a substrate surface to expose the substrate, and a cleaning treatment of cleaning the substrate may be performed after each exposure processing and before the heating processing.

According to another aspect, the present invention is a program running on a computer of a control unit for controlling a substrate processing system to perform a substrate processing method using the substrate processing system, the substrate processing system including a resist film forming unit for forming a resist film on the substrate, a developing treatment unit for performing a developing treatment for the substrate subjected to exposure processing, and a heating processing unit for heating-processing the substrate, wherein the substrate processing method is for performing a plurality of times exposure processing performed between the processing of forming the resist film and the developing treatment, and performing the substrate heating processing every time each exposure processing is finished.

The program may be stored in a computer-readable recording medium.

According to another aspect, the present invention is a substrate processing system, including a resist film forming unit for forming a resist film on the substrate; a developing treatment unit for performing a developing treatment for the substrate on which the resist film has been formed and then subjected to exposure processing; and a heating processing unit for heating-processing the substrate, wherein exposure processing is performed a plurality of times between the formation of the resist film and the developing treatment, and the substrate heating processing is performed in the heating processing unit every time each exposure processing is finished.

The substrate processing system may further include a first processing system having the resist film forming unit, the developing treatment unit, and the heating processing unit; and a second processing system having the heating processing unit, wherein the first processing system may be connected to one end of an aligner, and the second processing system may be connected to another end of the aligner on the opposite side of the first processing system, and wherein the first processing system and second processing system may be configured to be capable of transferring the substrate to the aligner.

A transfer unit for transferring the substrate between the aligner and the heating processing unit in the second processing system may be provided in the second processing system.

A housing unit for housing a plurality of substrates may be provided in the second processing system.

A cleaning unit for cleaning the substrate may be provided in the second processing system.

The heating processing after the exposure processing for a last time may be performed in the heating processing unit in the first processing system, and the heating processing after the exposure processing other than the exposure processing for the last time may be performed in the heating processing unit in the second processing system.

The substrate processing system may further include a processing section having the resist film forming unit and the developing treatment unit; and a transfer section facing the aligner side of the processing section, for transferring the substrate between the processing section and the aligner, wherein the heating processing unit may be provided in each of the transfer section and the processing section.

A cleaning unit for cleaning the substrate may be provided in the transfer section.

The heating processing after the exposure processing for a last time may be performed in the heating processing unit in the processing section, and the heating processing after the exposure processing other than the exposure processing for the last time may be performed in the heating processing unit in the transfer section.

[Effect of the Invention]

According to the present invention, a pattern in a desired shape can be formed on a resist film to improve yields.

Figure 1:
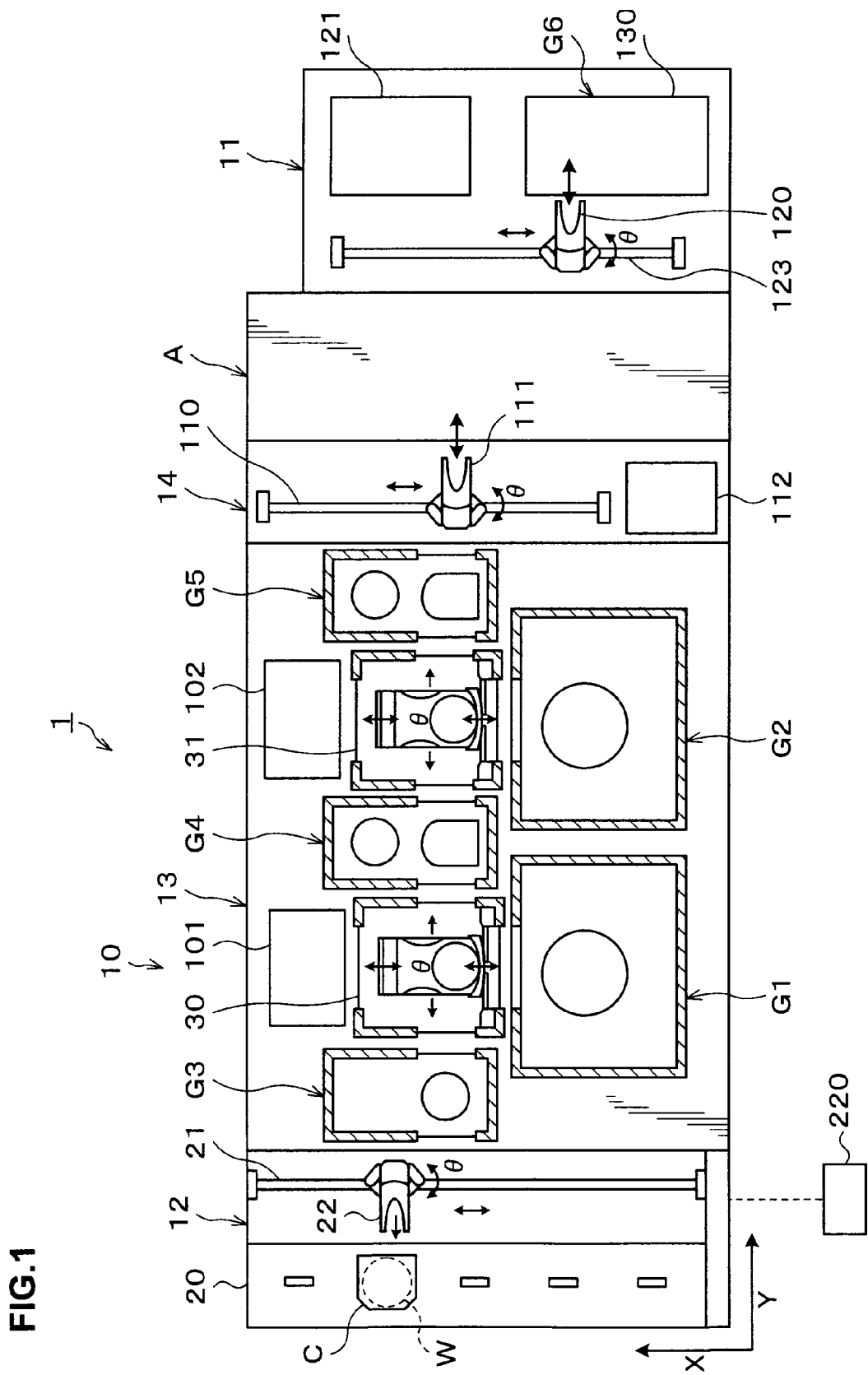
[FIG. 1] A plan view showing a configuration of a coating and developing treatment system.

EXPLANATION OF CODES 1 coating and developing treatment system
10 first processing system
11 second processing system
94 to 99, 130 to 133 post-exposure baking unit
120 wafer transfer unit
220 control unit
A aligner
W wafer

BEST MODE FOR CARRYING OUT THE INVENTION

Figure 2:
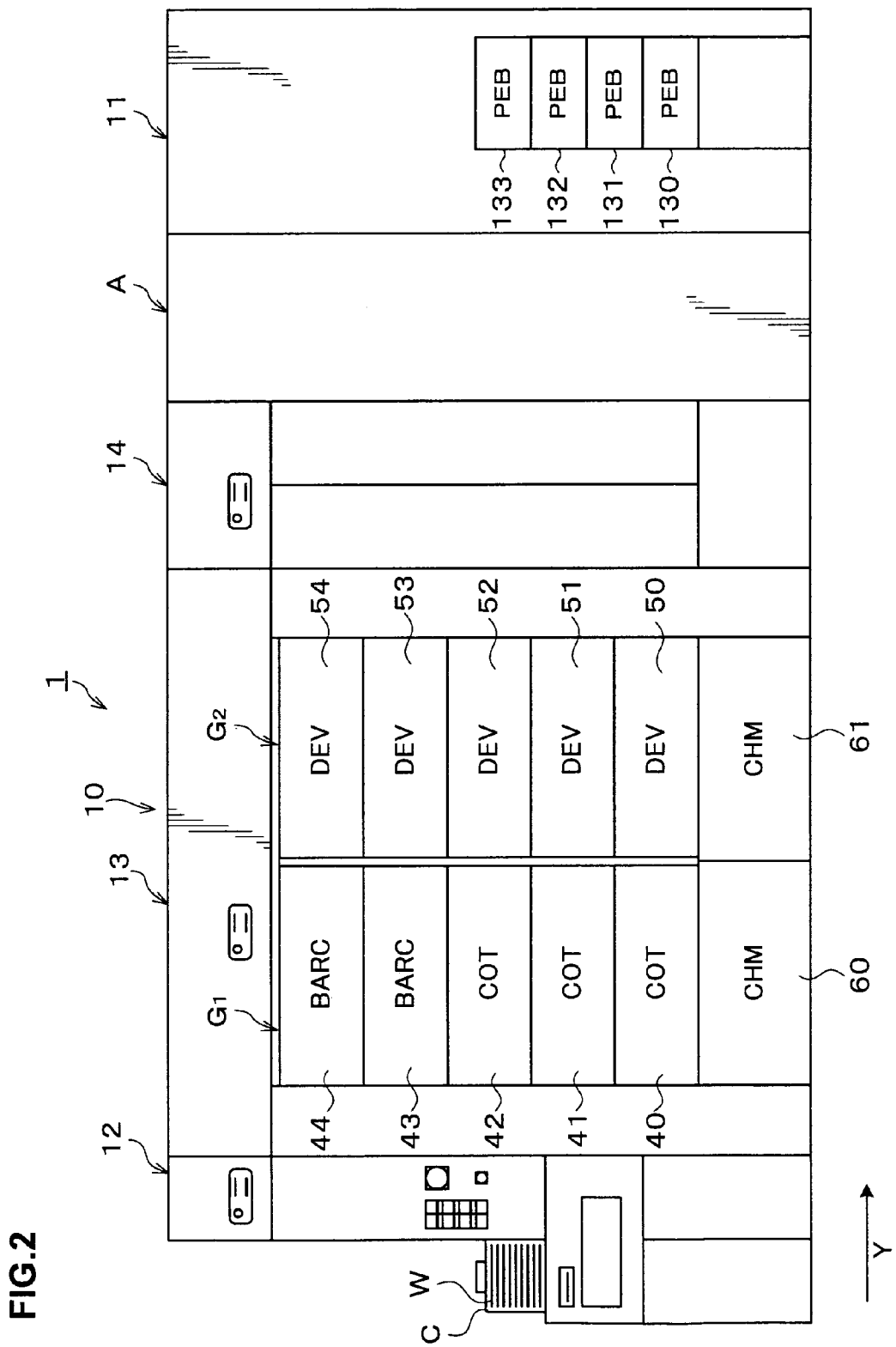
[FIG. 2] A front view of the coating and developing treatment system in FIG. 1.
Figure 3:
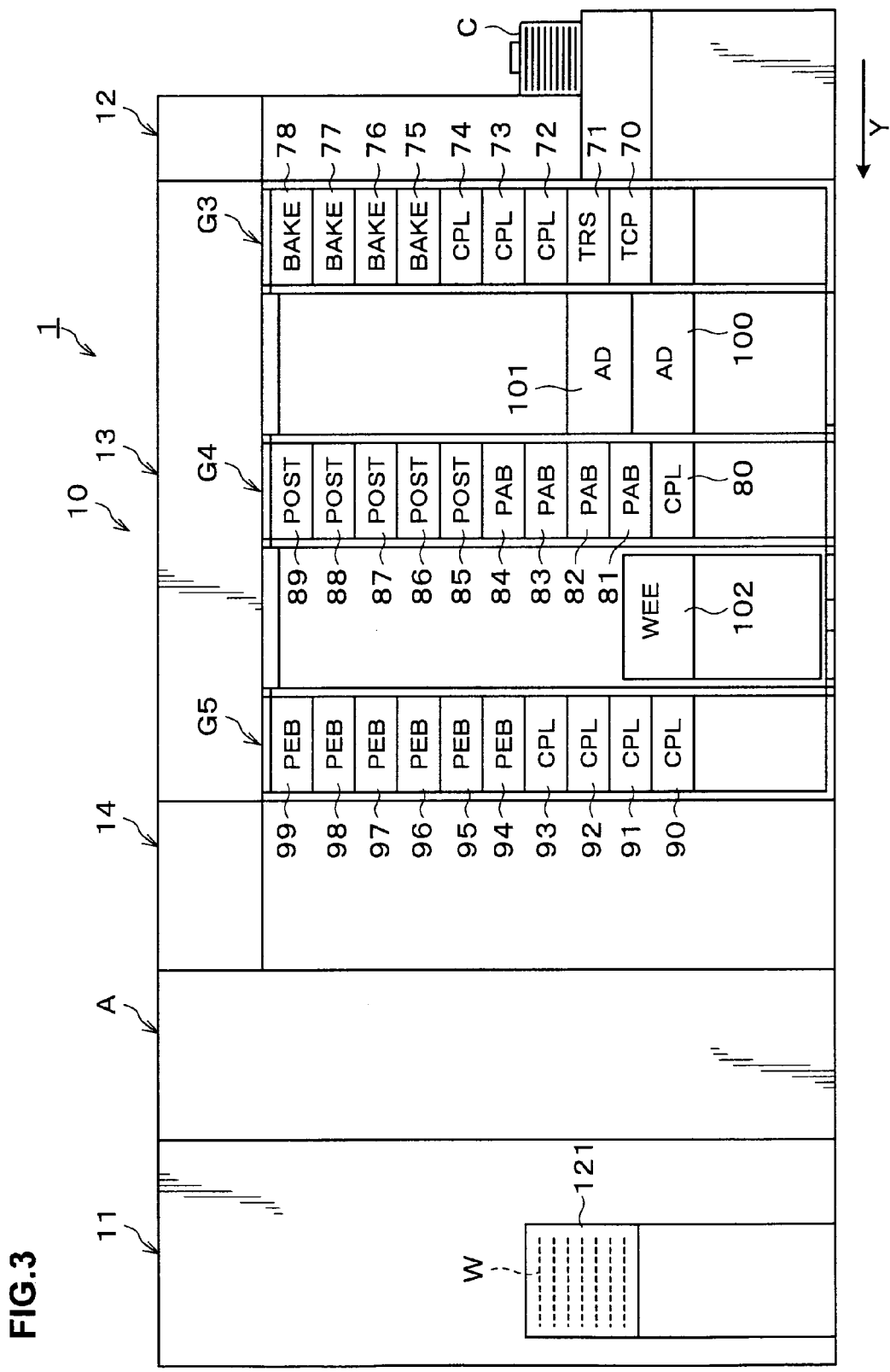
[FIG. 3] A rear view of the coating and developing treatment system in FIG. 1.

Hereinafter, preferred embodiments of the present invention will be described. FIG. 1 is a plan view showing the outline of a configuration of a coating and developing treatment system 1 as a substrate processing system according to this embodiment, FIG. 2 is a front view of the coating and developing treatment system 1, and FIG. 3 is a rear view of the coating and developing treatment system 1.

The coating and developing treatment system 1 has, for example, as shown in FIG. 1, a first processing system 10 and a second processing system 11 provided on both sides with an aligner A sandwiched therebetween. The first processing system 10 has a configuration in which, for example, a cassette station 12 for transferring, for example, 25 wafers W per cassette as a unit from/to the outside into/from the coating and developing treatment system 1 and transferring the wafers W into/out of a cassette C; a processing station 13 including a plurality of various kinds of processing and treatment apparatuses, which are multi-tiered, for performing various kinds of processing and treatments in a manner of single wafer processing in a photolithography process; and an interface station 14 as a transfer unit for passing the wafer W to/from the aligner A, are integrally connected. The cassette station 12, the processing station 13, and the interface station 14 are arranged in sequence toward the positive direction side in a Y-direction (the right direction in FIG. 1) where the aligner A is located, and the interface station 14 is connected to the aligner 14.

In the cassette station 12, a cassette mounting table 20 is provided and capable of mounting a plurality of cassettes C thereon in a line in an X-direction (a top-to-bottom direction in FIG. 1). In the cassette station 12, a wafer transfer body 22 is provided which is movable in the X-direction on a transfer path 21. The wafer transfer body 22 is also movable in a wafer-arrangement direction of the wafers W housed in the cassette C (a Z-direction; the vertical direction), and thus can selectively access the wafers W arranged in the vertical direction in each of the cassettes C. The wafer transfer body 22, which is rotatable around an axis in the vertical direction (a θ-direction), can access the processing units included in a later-described third processing unit group G3 on the processing station 13 side.

The processing station 13 includes, for example, five processing unit groups G1 to G5 in each of which a plurality of processing and treatment units are multi-tiered. On the side of the negative direction in the X-direction (the downward direction in FIG. 1) in the processing station 13, the first processing unit group G1 and the second processing unit group G2 are placed in order from the cassette station 12 side. On the side of the positive direction in the X-direction (the upward direction in FIG. 1) in the processing station 13, the third processing unit group G3, the fourth processing unit group G4, and the fifth processing unit group G5 are placed in order from the cassette station 12 side. Between the third processing unit group G3 and the fourth processing unit group G4, a first transfer unit 30 is provided. The first transfer unit 30 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 31 is provided. The second transfer unit 31 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 40, 41, and 42 each as a resist film forming unit for applying a resist solution to the wafer W to form a resist film, and bottom coating units 43 and 44 each for forming an anti-reflection film that prevents reflection of light during exposure processing, are five-tiered in order from the bottom. In the second processing unit group G2, solution treatment units, for example, developing treatment units 50 to 54 each for supplying a developing solution to the wafer W to perform developing treatment for it are five-tiered in order from the bottom. Further, chemical chambers 60 and 61 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 70, a transition unit 71 for passing the wafer W, high-precision temperature regulating units 72 to 74 each for regulating the wafer temperature under temperature control with a high precision, and thermal processing units 75 to 78 each for thermally processing the wafer W, are nine-tiered in order from the bottom.

In the fourth processing unit group G4, for example, a high-precision temperature regulating unit 80, pre-baking units 81 to 84 each for heating-processing the wafer W after the resist coating treatment, and post-baking units 85 to 89 each for heating-processing the wafer W after the developing treatment, are ten-tiered in order from the bottom.

In the fifth processing unit group G5, a plurality of thermal processing units each for thermally processing the wafer W, for example, high-precision temperature regulating units 90 to 93, and post-exposure baking units 94 to 99 as heating-processing units, are ten-tiered in order from the bottom.

As shown in FIG. 1, on the side of the positive direction in the X-direction (the upward direction in FIG. 1) of the first transfer unit 30, a plurality of treatment units are arranged, for example, adhesion units 100 and 101 each for performing hydrophobic treatment on the wafer W being two-tiered in order from the bottom as shown in FIG. 3. As shown in FIG. 1, on the side of the positive direction in the X-direction of the second transfer unit 31, for example, an edge exposure unit 102 is disposed which selectively exposes only the edge portion of the wafer W to light.

In the interface station 14, for example, a wafer transfer body 111 moving on a transfer path 110 extending in the X-direction and a buffer cassette 112 are provided as shown in FIG. 1. The wafer transfer body 111 is movable in the Z-direction and also rotatable in the θ-direction and thus can access the aligner A adjacent to the interface station 14, the buffer cassette 112, and the units in the fifth processing unit group G5 and transfer the wafer W to them.

In the second processing system 11, for example, a wafer transfer unit 120 as a transfer unit, a sixth processing unit group G6, and a buffer cassette 121 as a housing section are provided. The wafer transfer unit 120 is movable on a transfer path 123 extending in the X-direction provided on the aligner A side. The wafer transfer unit 120 is movable in the Z-direction and also rotatable in the θ-direction and thus can access the aligner A, the sixth processing unit group G6, and the buffer cassette 121 and transfer the wafer W to them. The wafer transfer unit 120 includes an alignment function for aligning the wafer W.

The sixth processing unit group G6 and the buffer cassette 121 are provided side by side in the X-direction on the positive direction side in the Y-direction of the transfer path 123. In the sixth processing unit group G6, post-exposure baking units 130 to 133 as heating-processing units are four-tiered in order from the bottom as shown in FIG. 2. The buffer cassette 121 can temporarily house a plurality of wafers W.

Figure 4:
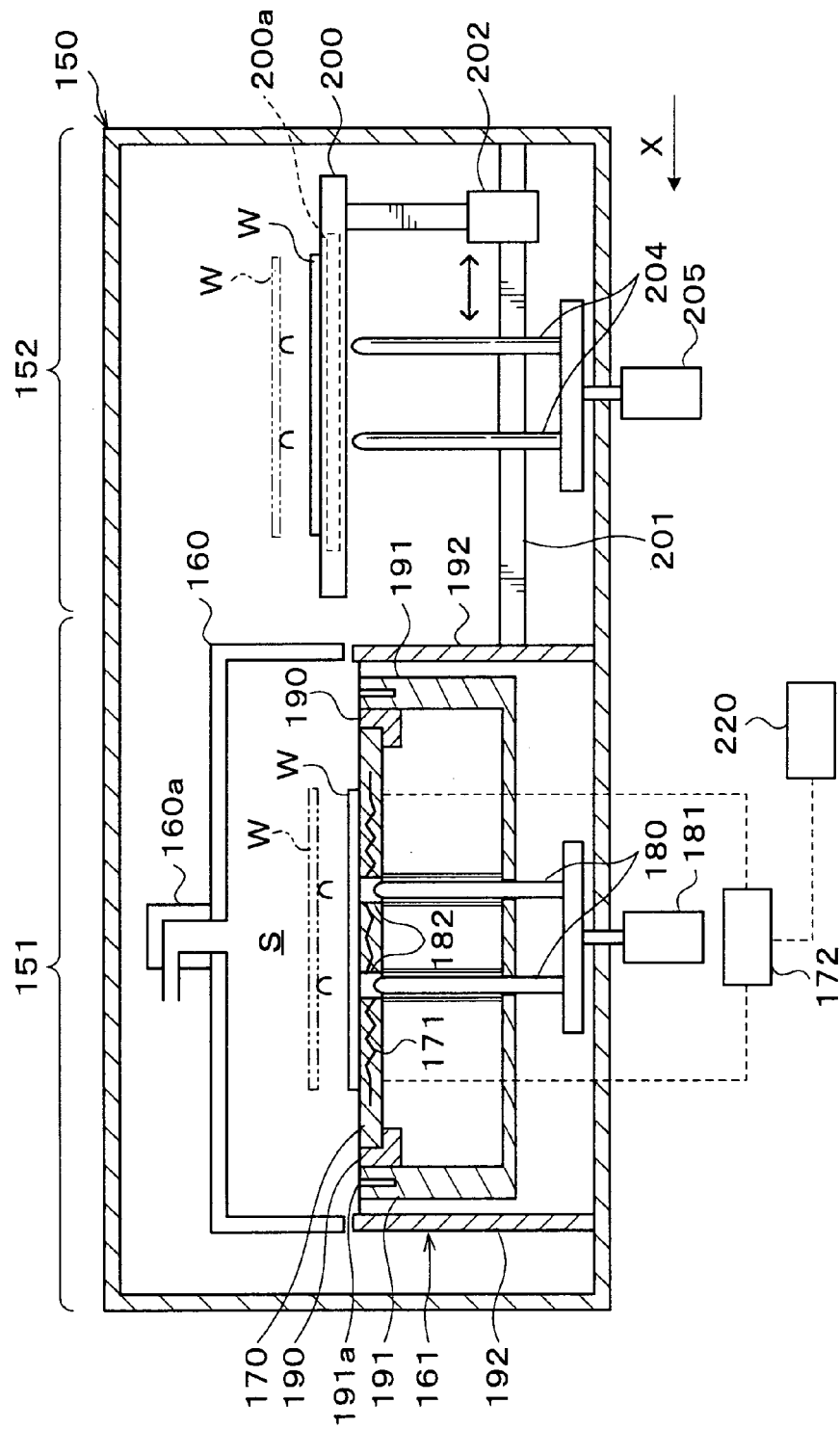
[FIG. 4] A longitudinal sectional view showing the outline of a configuration of a post-exposure baking unit.
Figure 5:
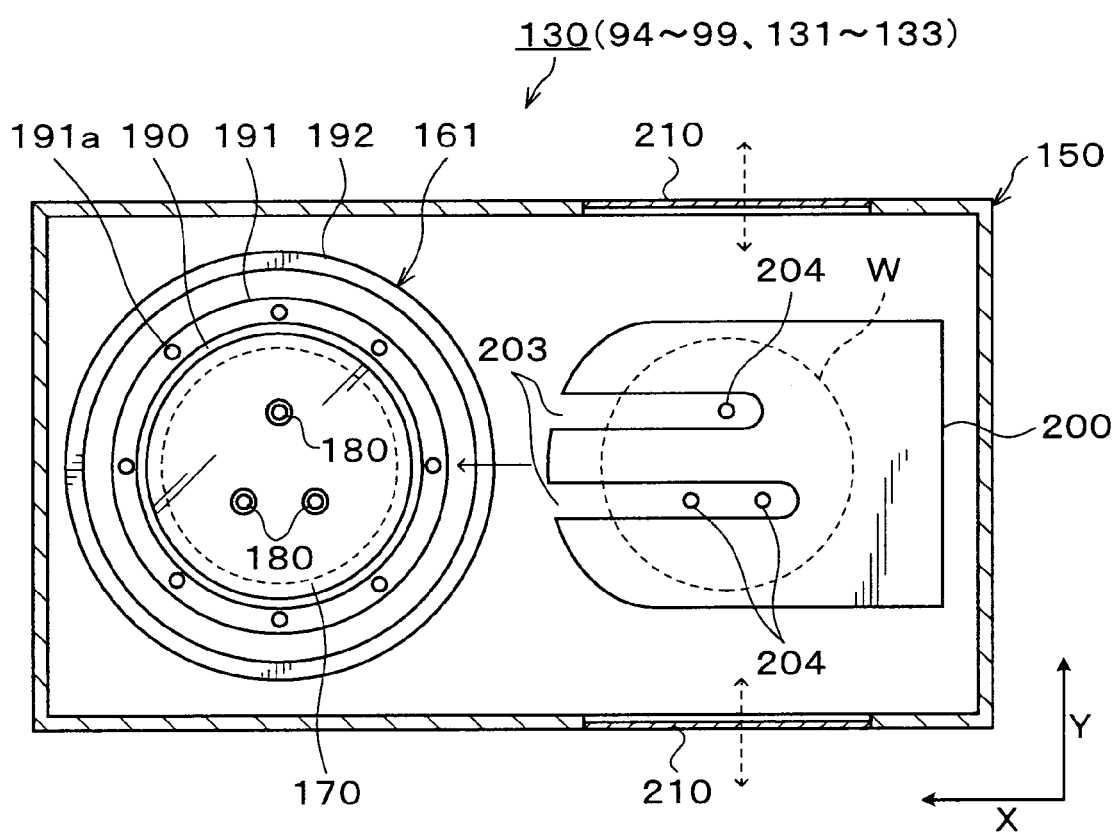
[FIG. 5] A transverse sectional view showing the outline of a configuration of a post-exposure baking unit.

Next, the configuration of the aforementioned post-exposure baking units 94 to 99 and 130 to 133 will be described. As shown in FIG. 4 and FIG. 5, for example, the post-exposure baking unit 130 comprises a heating section 151 for heating the wafer W and a cooling section 152 for cooling the wafer W in a housing 150.

The heating section 151 has, as shown in FIG. 4, a lid body 160 that is located on the upper side and vertically movable, and a thermal plate accommodating unit 161 that is located on the lower side and forms a processing chamber S together with the lid body 160.

The lid body 160 is provided with an exhaust portion 160a at its top portion, so that the atmosphere in the processing chamber S can be uniformly exhausted through the exhaust portion 160a.

At the center of the thermal plate accommodating unit 161, a thermal plate 170 is provided for mounting and heating the wafer W thereon. The thermal plate 170 has an almost disk shape with a large thickness. Inside the thermal plate 170, a heater 171 is embedded which generates heat by power feeding. The heating value of the heater 171 is adjusted, for example, by a heater controller 172. The temperature control in the heater controller 172 is performed, for example, by a later-described control unit 220.

As shown in FIG. 4, first raising and lowering pins 180 for supporting the wafer W from below and raising and lowering the wafer W are provided below the thermal plate 170. The first raising and lowering pins 180 are vertically movable by means of a raising and lowering drive mechanism 181. Near the central portion of the thermal plate 170, through holes 182 are formed which pass through the thermal plate 170 in its thickness direction. The first raising and lowering pins 180 can rise from below the thermal plate 170 and pass through the through holes 182 to project to above the thermal plate 170.

The thermal plate accommodating unit 161 has an annular holding member 190 for accommodating the thermal plate 170 and holding the outer peripheral portion of the thermal plate 170, and a support ring 191 almost in a cylindrical shape surrounding the outer periphery of the holding member 190. The upper surface of the support ring 191 is formed with blow ports 191a for jetting, for example, an inert gas toward the inside of the processing chamber S. The jetting of the inert gas from the blow ports 191a can purge the processing chamber S. Further, outside the support ring 191, a case 192 in a cylindrical shape is provided which is an outer periphery of the thermal plate accommodating unit 191.

In the cooling section 152 adjacent to the heating section 521, for example, a cooling plate 200 is provided which mounts and cools the wafer W thereon. The cooling plate 200 has, for example, an almost square flat-plate shape as shown in FIG. 5 with its end face on the heating plate 170 side curved in an arc shape protruding outward. As shown in FIG. 4, inside the cooling plate 200, for example, a cooling member 200a such as a Peltier element is embedded and can adjust the cooling plate 200 to a predetermined set temperature.

The cooling plate 200 is attached to a rail 201 extending toward the heating section 151 side. The cooling plate 200 can move on the rail 201 by means of a drive unit 202 and move to a position above the thermal plate 170 on the heating section 151 side.

The cooling plate 200 is formed with, for example, two slits 203 along the X-direction, for example, as shown in FIG. 5. The slits 203 are formed from the end surface on the heating section 151 side of the cooling plate 200 to the vicinity of the central portion of the cooling plate 200. The slits 203 prevent the cooling plate 200 which has moved to the heating section 151 side from interfering with the first raising and lowering pins 180 projecting to above the thermal plate 170. As shown in FIG. 4, second raising and lowering pins 204 are provided below the cooling plate 200. The second raising and lowering pins 204 can be raised and lowered by a raising and lowering drive unit 205. The second raising and lowering pins 204 can rise from below the cooling plate 200 and pass through the slits 203 to project to above the cooling plate 200.

As shown in FIG. 5, both side surfaces of the housing 150 across the cooling plate 200 are formed with transfer-in/out ports 210 for transferring-in/out the wafer W.

It should be noted that the other post-exposure baking units 94 to 99 and 131 to 133 have the same configuration as that of the above-described post-exposure baking unit 130 and therefore their description will be omitted.

The control of the wafer processing in the coating and developing treatment system 1 is performed, for example, by the control unit 220 shown in FIG. 1. The control unit 220 is composed of a general-purpose computer comprising, for example, a CPU and a memory, and connected to the various kinds of processing and treatment units such as the resist coating units 40 to 42, the post-exposure baking units 94 to 99 and 130 to 133, and the developing treatment units 50 to 54, and to the various kinds of transfer units such as the wafer transfer body 22, the first transfer unit 30, the second transfer unit 31, the wafer transfer body 111, and the wafer transfer unit 120. The control unit 220 can execute the program recorded, for example, on the memory to control the operation of the processing and treatment units and the transfer units, thereby realizing the later-described desired wafer processing. The program which is executed by the control unit 220 may be recorded on a computer-readable recording medium and installed from the recording medium to the control unit 220.

Figure 6:
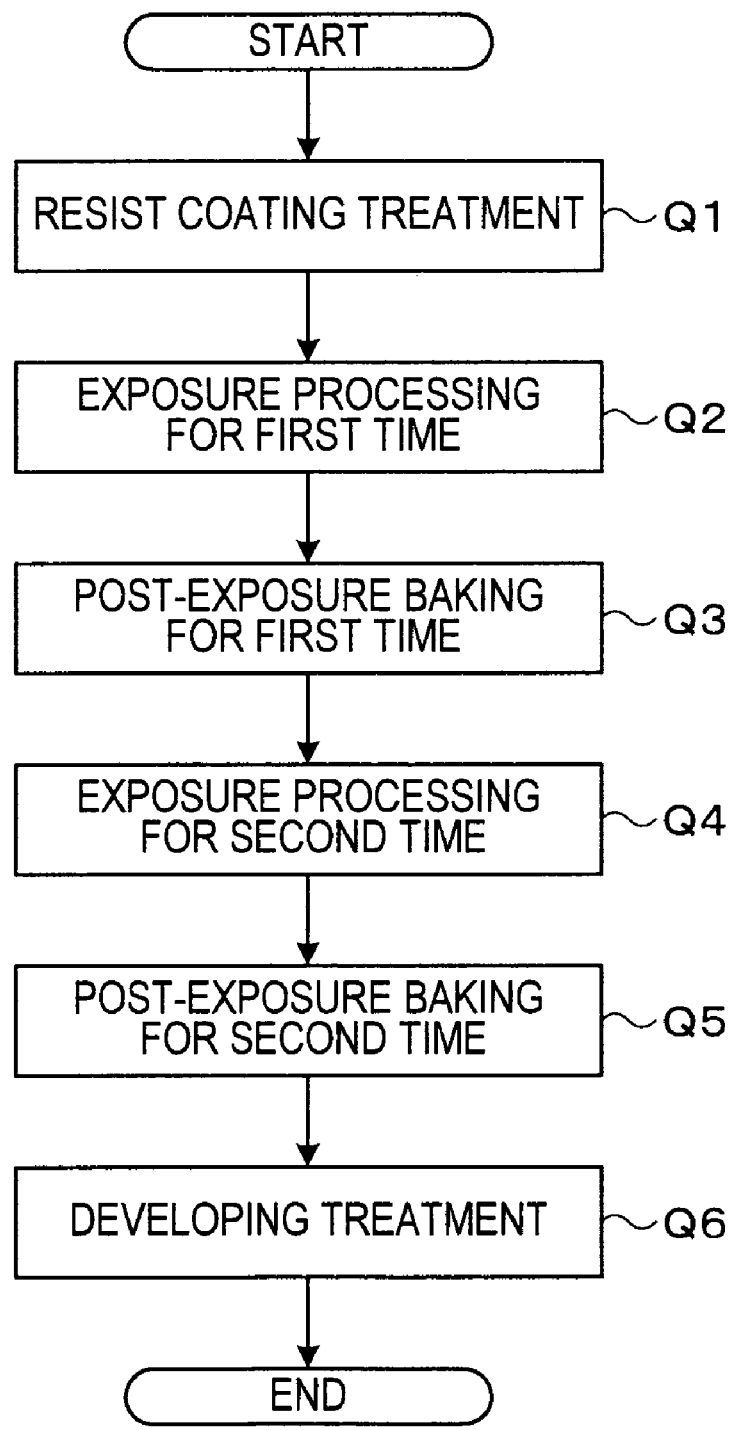
[FIG. 6] A flowchart of wafer processing.

Next, the process of the wafer processing in the coating and developing treatment system 1 configured as described above will be described. FIG. 6 is a flowchart showing main process steps of the wafer processing.

First of all, unprocessed wafers W are taken out of the cassette C on the cassette mounting table 20 one by one by the wafer transfer body 22 shown in FIG. 1, and transferred to the processing station 13 in sequence. The wafer W is transferred to the temperature regulating unit 70 included in the third processing unit group G3 in the processing station 13 where the wafer W is temperature-regulated to a predetermined temperature, and is then transferred by the first transfer unit 30, for example, to the bottom coating unit 43 where an anti-reflection film is formed thereon. The wafer W is then transferred by the first transfer unit 30 to the thermal processing unit 75, the high-precision temperature regulating unit 80 in sequence, so that predetermined processing is performed in each of the units. Thereafter, the wafer W is transferred by the first transfer unit 30 to the resist coating unit 40.

In the resist coating unit 40, a predetermined amount of resist solution is supplied, for example, to the front surface of the rotated wafer W from a nozzle so that the resist solution is spread to the entire surface of the wafer W to form a resist film on the wafer W (Step Q1 in FIG. 6).

The wafer W on which the resist film has been formed is transferred by the first transfer unit 30, for example, to the pre-baking units 81 where it is subjected to heating-processing (pre-baking), and then transferred by the second transfer unit 31 to the edge exposure unit 102 and the high-precision temperature regulating unit 93 in sequence so that predetermined processing is performed in each of the units. Thereafter, the wafer W is transferred by the wafer transfer body 111 in the interface station 14 to the aligner A. When the wafer W is transferred to the aligner A, light is applied to the resist film on the wafer W via a mask from an exposure light source, whereby a predetermined pattern is exposed on the resist film. Thus, exposure processing for the first time is performed on the wafer W (Step Q2 in FIG. 6).

The wafer W for which the exposure processing for the first time has been finished is transferred by the wafer transfer unit 120, for example, to the post-exposure baking unit 130 in the second processing system 11 on the other side of the aligner A.

In the post-exposure baking unit 130, the wafer is first transferred thereinto through the transfer-in/out port 210 and mounted on the cooling plate 200 shown in FIG. 4. Subsequently, the cooling plate 200 is moved to move the wafer W to a position above the thermal plate 170. The wafer W is passed from the cooling plate 200 to the first raising and lowering pins 180 and mounted onto the thermal plate 170 by the first raising and lowering pins 180. Thus, the heating processing (post-exposure baking) for the wafer W is started (Step Q3 in FIG. 6). After a lapse of a predetermined time, the wafer W is then separated from the thermal plate 170 by the first raising and lowering pins 180, with which the heating processing for the wafer W ends. Thereafter, the wafer W is passed from the first raising and lowering pins 180 to the cooling plate 200 and cooled, and then transferred out from the cooling plate 200 via the transfer-in/out port 210 to the outside of the post-exposure baking unit 130.

The wafer W for which the post-exposure baking for the first time has been finished is transferred by the wafer transfer unit 120 shown in FIG. 1 to the buffer cassette 121 and temporarily housed therein. The wafer W waits in the buffer cassette 121, for example, until the above-described exposure processing and post-exposure baking for the first time are finished for the other wafers in the same lot. Thereafter, the wafer W is taken out of the buffer cassette 121 by the wafer transfer unit 120 and transferred to the aligner A. For the wafer W transferred to the aligner A, for example, a pattern different from that in the exposure processing for the first time is exposed on the resist film, whereby exposure processing for the second time is performed (Step Q4 in FIG. 6). The wafer W for which the exposure processing for the second time has been finished is transferred by the wafer transfer body 111 in the interface station 14, for example, to the post-exposure baking unit 94 in the processing station 13.

The wafer W transferred to the post-exposure baking unit 94 is first passed to the cooling plate 200 and passed from the cooling plate 200 to the first raising and lowering pins 180, in a similar manner to the heating processing in the above-described post-exposure baking unit 130. The wafer W is then mounted onto the thermal plate 170 by the first raising and lowering pins 180, whereby the heating processing (post-exposure baking) for the wafer W is started (Step Q5 in FIG. 6). After a lapse of a predetermined time, the wafer W is then raised by the first raising and lowering pins 180, with which the heating processing for the wafer W ends. Thereafter, the wafer W is passed to the cooling plate 200 and cooled, and then transferred out of the post-exposure baking unit 94.

The wafer W for which post-exposure baking for the second time has been finished is transferred by the second transfer unit 31, for example, to the developing treatment unit 50 where the resist film on the wafer W is developed (Step Q6 in FIG. 6). The wafer W is then transferred by the second transfer unit 31 to the post-baking unit 85 where the wafer W is subjected to heating processing (post-baking) and then transferred by the first transfer unit 30 to the high-precision temperature regulating unit 72 where the wafer W is temperature-regulated. The wafer W is then returned by the wafer transfer body 22 to the cassette C in the cassette station 12. Thus a series of steps of the wafer processing in the coating and developing treatment system 1 ends.

According to the above embodiment, in the wafer processing in which exposure processing is performed twice in order to form a pattern on the resist film in the photolithography process, post-exposure baking is performed after each of the exposure processing for the first time and the second time, so that the difference in time period from the end of the exposure processing to the start of the post-exposure baking (PED time), between the first time and the second time, can be reduced. As a result, variations in the pattern dimension between exposed portions which have been subjected to the exposure processing for the first time and the second time are reduced to improve the consistency of the dimension of the pattern of the exposed portion in each exposure processing, so that a pattern in a desired shape can be finally formed on the wafer W.

Since the second processing system 11 having the post-exposure baking units 130 to 133 is provided on the opposite side across the aligner A as seen from the first processing system 10 in the above embodiment, the wafer W for which the exposure processing for the first time has been finished can be transferred out from the opposite side of the aligner A to the second processing system 11 and subjected to the post-exposure baking in the post-exposure baking units 130 to 133. In this case, it is not necessary to use the wafer transfer body 111 in the interface station 14 which passes the wafer W between the processing station 13 and the aligner A, and the dedicated wafer transfer unit 120 can be used to transfer the wafer W to the post-exposure baking units 130 to 133. Therefore, the wafer W for which the exposure processing for the first time has been finished can be smoothly transferred to the post-exposure baking units 130 to 133 regardless of, for example, the operating condition of the wafer transfer body 111. As a result, the time period from the end of the exposure processing to the start of the post-exposure baking for the first time can be stably controlled. Further, the use of the wafer transfer unit 120 accordingly reduce the burden on the wafer transfer body 111 to also allow for stable control of the time period from the end of the exposure processing to the start of the post-exposure baking for the second time. As a result, the difference in time period from the end of the exposure processing to the start of the post-exposure baking, between the first time and the second time, can be reduced more stably and positively, so that a pattern with a desired dimension can be finally formed on the wafer W.

Since the buffer cassette 121 is provided in the second processing station 11, the wafers W in one lot for which the post-exposure baking has been finished can be housed therein and kept wait for the exposure processing for the second time.

In the above embodiment, control may be positively conducted such that the time periods from the ends of the exposure processing to the starts post-exposure baking for the first time and the second time are equal. For example, the control unit 220 controls the operations of the wafer transfer unit 120 and the wafer transfer body 111 to manage time such that the time period from the end of the exposure processing to the start of the post-exposure baking for the first time is equal to the time period from the end of the exposure processing to the start of the post-exposure baking for the second time. This can eliminate the difference in the time period from the end of the exposure processing to the start of the post-exposure baking, between the first time and the second time, resulting in no variation in the pattern dimension between exposed portions for the first time and the second time, thus allowing for formation of a pattern with more precise dimension.

Incidentally, the exposed portion of the resist film in the exposure processing for the second time is then subjected to post-exposure baking once more (post-exposure baking for the second time), in which the exposed portion which has been subjected to the exposure processing for the first time will be subjected to the post-exposure baking twice in total (the post-exposure baking for the first time+the post-exposure baking for the second time). To correct the variations in pattern dimension due to the difference in the number of times of the post-exposure baking, for example, the exposure conditions of the exposure processing for the first time and the exposure processing for the second time may be varied. For example, the exposure time for the first time may be made shorter than the exposure time for the second time to decrease the exposure amount of the exposure processing for the first time. In this case, for example, the control unit 220 sets the exposure amount of the exposure processing for the first time in the aligner A to about 20 mJ/cm$^2$, and sets the exposure amount of the exposure processing for the second time to about 25 mJ/cm$^2$. In this event, the heating time (about 30 seconds) and the heating temperature (about 120° C.) of the post-exposure baking are set equally for the first time and the second time. This ensures that even if the exposed portion in the exposure processing for the first time is subjected to the post-exposure baking twice, patterns having the same dimension can be formed in the first time and the second time, thus finely adjusting the final pattern.

Further, in place of the exposure conditions of the exposure processing in the above example, the heating conditions of the post-exposure baking for the first time and the second time may be varied. In this case, the heating time for the first time may be made shorter than the heating time for the second time, or the heating temperature for the first time may be made lower than the heating temperature for the second time, or both of them may be performed. In this case, the exposure condition of the exposure processing is set equally for the first time and the second time. This can also reduce the influence due to the exposed portion in the exposure processing for the first time being subjected to the post-exposure baking more than the exposed portion in the exposure processing for the second time, thus finally forming a pattern in a desired shape. Note that both the exposure conditions of the exposure processing and the heating conditions of the post-exposure baking for the first time and the second time may be varied so that a pattern with a desired dimension is finally formed.

Although the light from the light source is directly applied to the wafer W in the exposure processing described in the above embodiment, with a liquid layer transmitting the light being formed on the front surface of the wafer W, the resist film on the wafer W may be exposed to light via the liquid layer. Note that the technique of transmitting light through the liquid layer on the wafer surface for exposure is proposed in Japanese Patent Application Laid-open No. 2006-49757.

Figure 7:
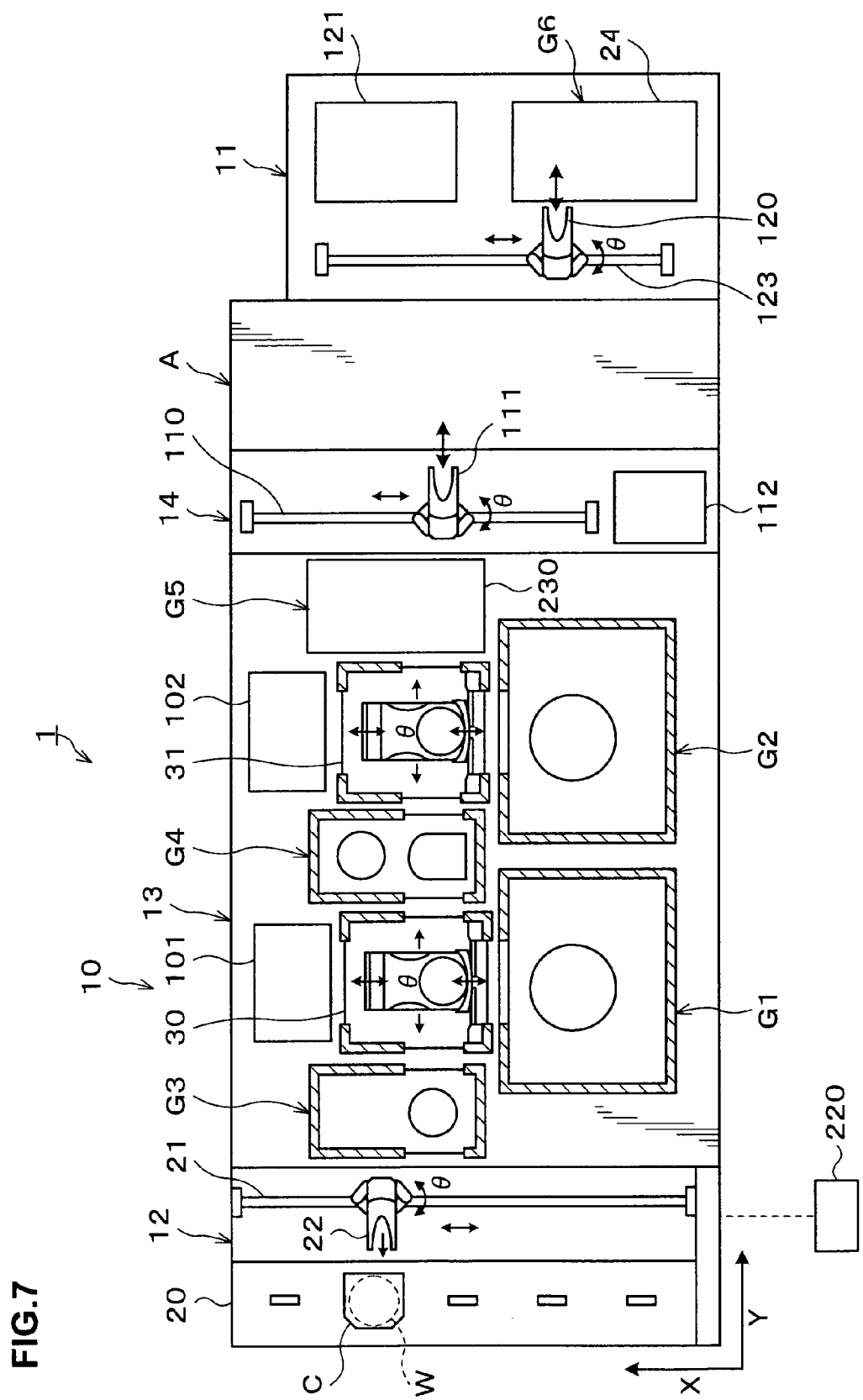
[FIG. 7] A plan view showing a configuration of a coating and developing treatment system including a cleaning unit.

In this case, cleaning units 230 and 240 each for cleaning the wafer W after the exposure processing may be provided in the processing station 13 and the second processing system 11, for example, as shown in FIG. 7. For example, the cleaning unit 230 in the processing station 13 is provided in the fifth processing unit group G5 to which the wafer W can be transferred by the wafer transfer body 111. For example, the cleaning unit 240 in the second processing system 11 is provided, for example, in the sixth processing unit group G6 to which the wafer W can be transferred by the wafer transfer unit 120.

Figure 8:
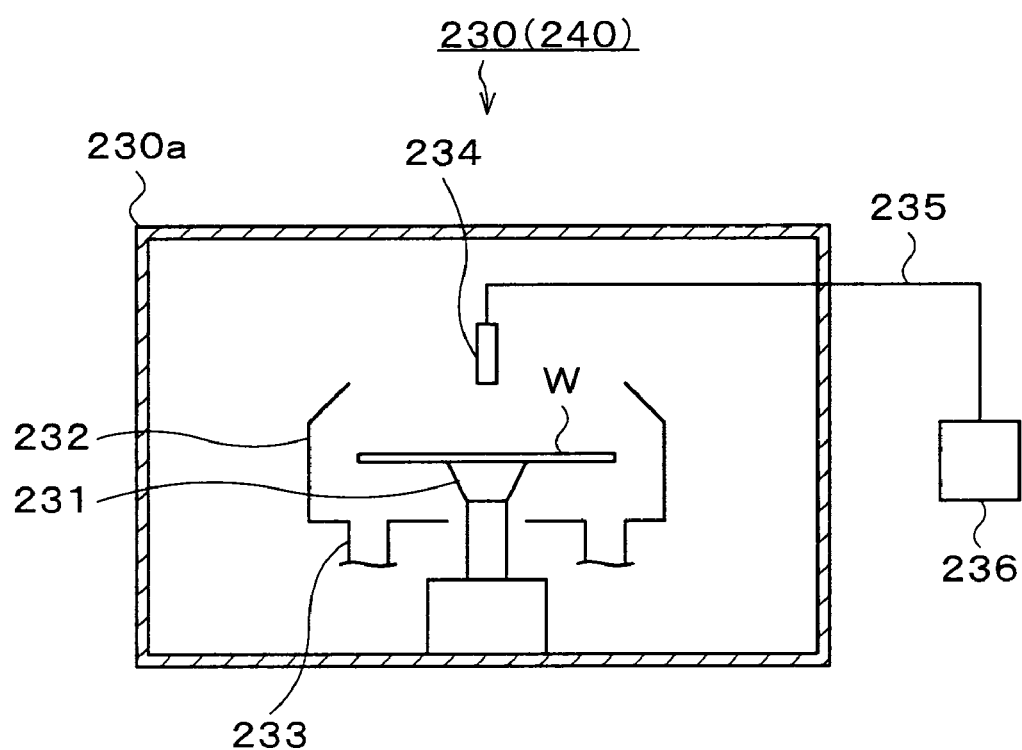
[FIG. 8] A longitudinal sectional view showing a configuration of the cleaning unit.

The cleaning unit 230 has, for example, a casing 230a as shown in FIG. 8, and a spin chuck 231 for horizontally holding and rotating the wafer W is provided at the central portion in the casing 230a. Around the spin chuck 231, a cup 233 is provided for receiving and collecting a cleaning solution scattering from the wafer W. To the bottom surface of the cup 232, a drain pipe 233 is connected. Above the spin chuck 231, a cleaning solution discharge nozzle 234 is provided for discharging the cleaning solution to the wafer W. The cleaning solution discharge nozzle 234 is connected to a cleaning solution supply source 236 via a supply pipe 235.

Note that the cleaning unit 240 has the same configuration as that of the above-described cleaning unit 230, and therefore the description therefor will be omitted.

Figure 9:
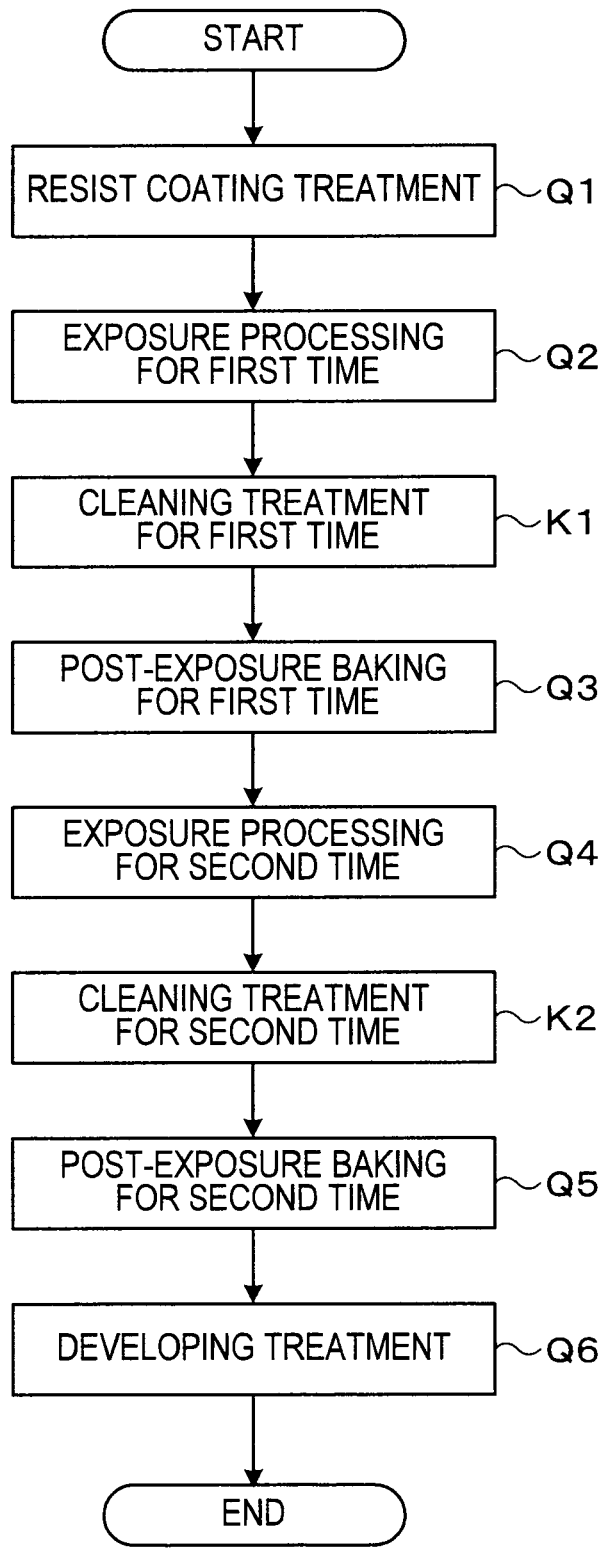
[FIG. 9] A flowchart showing of the wafer processing when performing a cleaning treatment.

Next, the process of the wafer processing when the cleaning units 230 and 240 are provided will be described. FIG. 9 is a flowchart showing main process steps of the wafer processing. First of all, the wafer W in the cassette station 12 is transferred to the processing station 13, for example, to the temperature regulating unit 70, the bottom coating unit 43, the thermal processing unit 75, and the high-precision temperature regulating unit 80 in sequence so that predetermined processing is performed as in the above embodiment. Thereafter, the wafer W is transferred to the resist coating unit 40 where a resist film is formed thereon (Step Q1 in FIG. 9). The wafer W is then transferred, for example, to the pre-baking unit 81, the edge exposure unit 102, and the high-precision temperature regulating unit 93 in sequence so that predetermined processing is performed, and then transferred to the aligner A.

Figure 10:
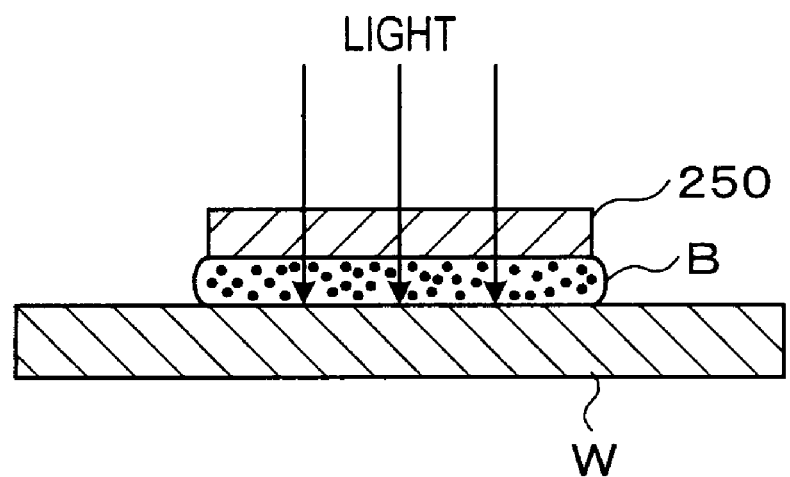
[FIG 10] A schematic view for explaining exposure processing performed with a liquid layer being formed on a wafer.

In the aligner A, for example, a liquid layer B that transmits light is formed between a lens 250 and the wafer W as shown in FIG. 10, so that light is transmitted through the lens 250 and the liquid layer B to perform the exposure processing for the first time for the resist film (Step Q2 in FIG. 9). The wafer W is then transferred by the wafer transfer unit 120 from the aligner A to the cleaning unit 240 in the second processing system 11.

In the cleaning unit 240, the wafer W is first held on the spin chuck 231. The wafer W is rotated by the spin chuck 231, and the cleaning solution is discharged from the cleaning solution discharge nozzle 234 to the rotated wafer W. This removes the liquid adhering to the front surface of the wafer W in the exposure processing to thereby clean the wafer W (Step K1 in FIG. 9). Then, the discharge of the cleaning solution is stopped, and the spin chuck 231 rotates the wafer W at a high speed to dry the wafer W. The dried wafer W is transferred out of the cleaning unit 240 by the wafer transfer unit 120, for example, to the post-exposure baking unit 130.

The wafer W transferred to the post-exposure baking unit 130 is passed to the thermal plate 170 as in the above-described embodiment and subjected to heating processing (post-exposure baking) for a predetermined time (Step Q3 in FIG. 9). The wafer W is then cooled on the cooling plate 200, and taken out of the post-exposure baking unit 130 by the wafer transfer unit 120 and transferred to the buffer cassette 121. The wafer W is then transferred by the wafer transfer unit 120 again to the aligner A where light is transmitted to the liquid layer on the front surface of the wafer W to perform the exposure processing for the second time for a pattern different from that for the first time (Step Q4 in FIG. 9). The wafer W for which the exposure processing for the second time has been finished is transferred through the interface station 14 to the cleaning unit 230 in the processing station 13 and cleaned there (Step K2 in FIG. 9). In the cleaning unit 230, the wafer W is rotated while the cleaning solution is being supplied in a similar manner to the cleaning treatment in the above-described cleaning unit 240, whereby the cleaning of the wafer W is performed. The wafer W is then transferred to the post-exposure baking unit 94 and subjected to heating processing (post-exposure baking) (Step Q5 in FIG. 9). The wafer W is then developed in the developing treatment unit 50 (Step Q6 in FIG. 9), and then transferred to the post-baking unit 85 and the high-precision temperature regulating unit 72 in sequence and returned to the cassette C in the cassette station 12.

According to this example, the wafer W can be cleaned and dried immediately after the exposure processing for the first time and the second time, thereby preventing the liquid used in the exposure processing from remaining on the resist film to cause defects in the resist film. Note that, also in this example, the time periods from the exposure processing to the post-exposure baking for the first time and the second time may be strictly controlled by the control unit 220 so that, for example, the time periods from the exposure processing to the post-exposure baking for the first time and the second time are equal.

Figure 11:
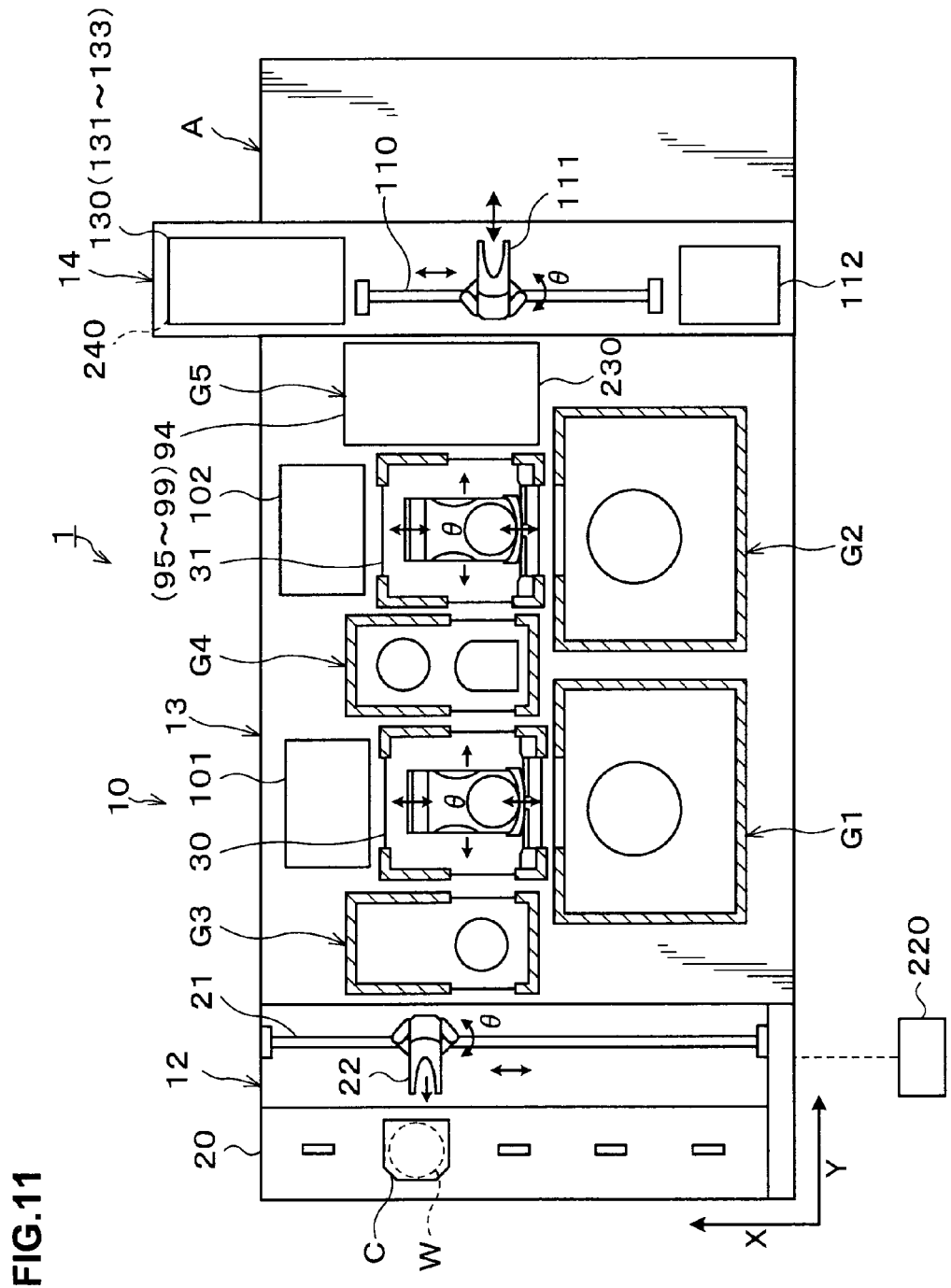
[FIG. 11] A plan view showing a coating and developing treatment system where a post-exposure baking unit for performing post-exposure baking for the first time is provided in an interface station.

Although the post-exposure baking units 130 to 133 which perform the post-exposure baking and the cleaning unit 240 which performs the cleaning treatment for the first time are provided in the second processing system 11 in the above embodiment, they may be provided, for example, in the interface station 14 as shown in FIG. 11. In this case, the post-exposure baking units 94 to 99 which perform the post-exposure baking and the cleaning unit 230 which performs the cleaning treatment for the second time are provided in the processing station 13.

Figure 12:
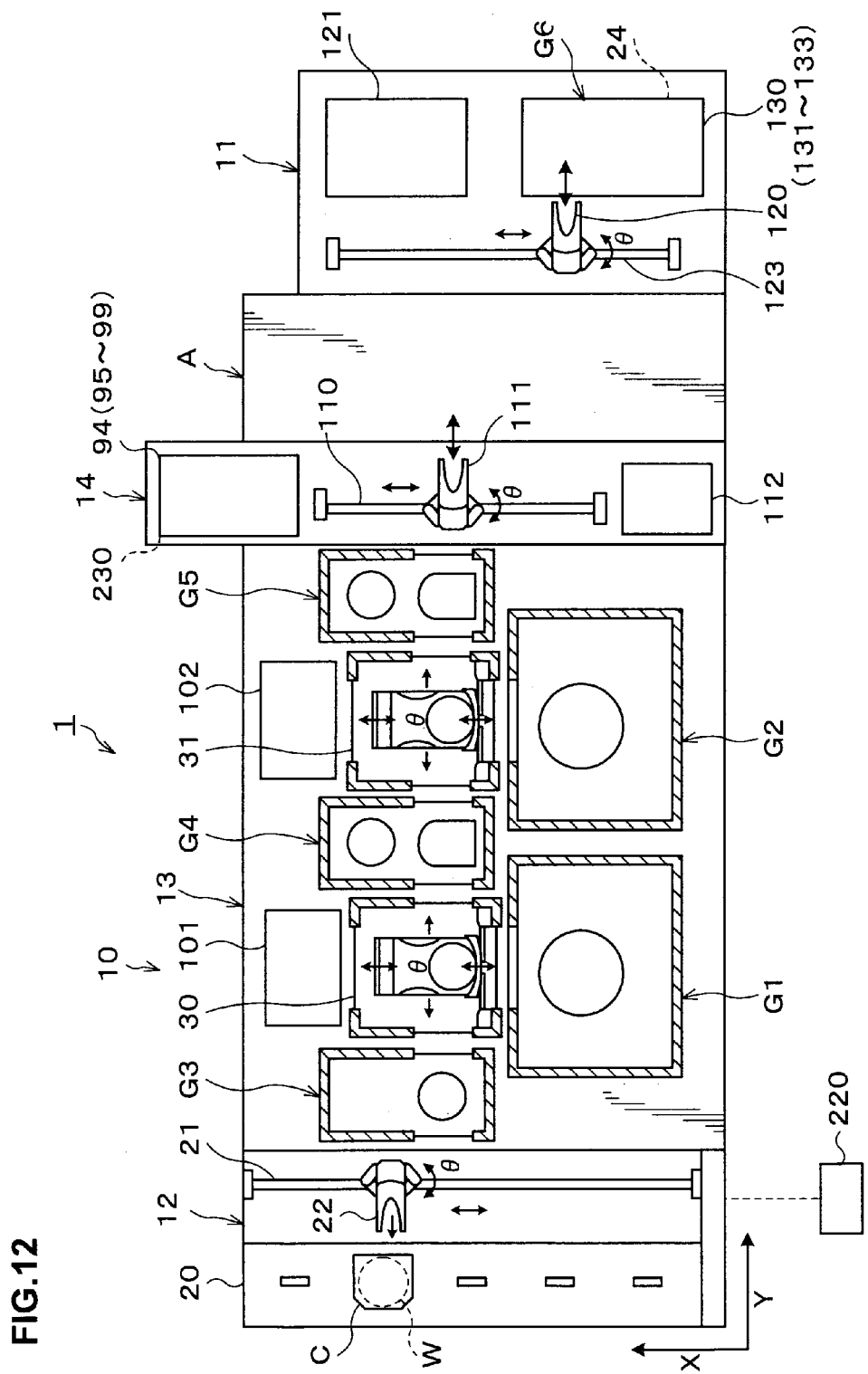
[FIG. 12] A plan view showing a coating and developing treatment system where a post-exposure baking unit for performing post-exposure baking for the second time is provided in an interface station.

Further, although the post-exposure baking units 94 to 99 which perform the post-exposure baking and the cleaning unit 230 which performs the cleaning treatment for the second time are provided in the processing station 13 in the above embodiment, they may be provided, for example, in the interface station 14 as shown in FIG. 12. In this case, the post-exposure baking units 130 to 133 which perform the post-exposure baking and the cleaning unit 240 which performs the cleaning treatment for the first time are provided in the second processing system 11.

The preferred embodiments of the present invention have been described above with reference to the accompanying drawings, but the present invention is not limited to the embodiments. It should be understood that various changes and modifications will be readily apparent to those skilled in the art within the scope of the spirit as set forth in claims, and those should also be covered by the technical scope of the present invention. For example, the number of times of the exposure processing is two, and the present invention is also applicable to the case of three times or more. In this case, for example, the post-exposure baking after the exposure processing for the last time may be performed in the post-exposure baking units 94 to 99, and the post-exposure baking after the exposure processing other than the exposure processing for the last time may be performed in the post-exposure baking units 130 to 133. Further, a detection unit capable of measuring the dimension such as, for example, the line width and the like may be incorporated in the substrate processing system, so that the detection result by the detection unit may be fed forward to control the exposure time and the post-exposure baking or developing time. Further, the present invention is also applied to processing of substrates other than the wafer W, such as an FPD (Flat Panel Display), a mask reticle for a photomask, and the like.

INDUSTRIAL APPLICABILITY

The present invention is useful in forming a pattern with a desired dimension in pattern forming processing in which exposure processing is performed a plurality of times between the resist film forming processing and the developing treatment.

The invention claimed is:
1. A substrate processing method,
wherein exposure processing performed between processing of forming a resist film and developing treatment is performed a plurality of times, and substrate heating processing is performed every time each exposure processing is finished,
wherein time periods from ends of said exposure processing to starts of said heating processing are controlled to be equal to each other, wherein a different heating condition is set for every heating processing after said each exposure processing, and
wherein the heating conditions of said heating processing for a second time, a third time, and each subsequent time are set to be shorter in heating time and lower in heating temperature than those of said heating processing for an immediately preceding time.

2. The substrate processing method as set forth in claim 1, wherein a different exposure condition is set for said each exposure processing.

3. The substrate processing method as set forth in claim 2, wherein the exposure conditions of said exposure processing for a second time and subsequent times are set to be less in exposure amount than that of said exposure processing for an immediately preceding time.

4. The substrate processing method as set forth in claim 1, wherein said exposure processing is for transmitting light through a liquid on a substrate surface to expose the substrate, and
wherein a cleaning treatment of cleaning the substrate is performed after said each exposure processing and before said heating processing.

5. A non-transitory computer-readable recording medium storing a program, said program running on a computer of a control unit for controlling a substrate processing system to perform a substrate processing method using the substrate processing system, said substrate processing system comprising a resist film forming unit for forming a resist film on the substrate, a developing treatment unit for performing a developing treatment for the substrate subjected to exposure processing, and a heating processing unit for heating-processing the substrate,
wherein the substrate processing method is for performing a plurality of times exposure processing performed between the processing of forming the resist film and the developing treatment, and performing the substrate heating processing every time each exposure processing is finished,
wherein time periods from ends of said exposure processing to starts of said heating processing are controlled to be equal to each other,
wherein a different heating condition is set for every heating processing after said each exposure processing, and
wherein the heating conditions of said heating processing for a second time, a third time, and each subsequent time are set to be shorter in heating time and lower in heating temperature than those of said heating processing for an immediately preceding time.

6. A substrate processing system, comprising:
a resist film forming unit for forming a resist film on the substrate;
a developing treatment unit for performing a developing treatment for the substrate on which the resist film has been formed and then subjected to exposure processing; and
a heating processing unit for heating-processing the substrate,
wherein exposure processing is performed a plurality of times between the formation of the resist film and the developing treatment, and the substrate heating processing is performed in said heating processing unit every time each exposure processing is finished, the substrate processing system further including:
a first processing system including said resist film forming unit, said developing treatment unit, and said heating processing unit; and
a second processing system including a second heating processing unit,
wherein said first processing system is connected to one end of an aligner, and said second processing system is connected to another end of said aligner on the opposite side of the aligner as of said first processing system, and
wherein said first processing system and second processing system transfer the substrate to said aligner.

7. The substrate processing system as set forth in claim 6, wherein a transfer unit for transferring the substrate between said aligner and said heating processing unit in said second processing system is provided in said second processing system.

8. The substrate processing system as set forth in claim 6, wherein a housing unit for housing a plurality of substrates is provided in said second processing system.

9. The substrate processing system as set forth in claim 6, wherein a cleaning unit for cleaning the substrate is provided in said second processing system.

10. The substrate processing system as set forth in claim 6, wherein the heating processing after the exposure processing for a last time is performed in said heating processing unit in said first processing system, and
wherein the heating processing after the exposure processing other than the exposure processing for the last time is performed in said heating processing unit in said second processing system.

11. The substrate processing system as set forth in claim 6, further comprising:
a processing section having said resist film forming unit and said developing treatment unit; and
a transfer section facing the aligner side of said processing section, for transferring the substrate between said processing section and said aligner,
wherein said heating processing unit is provided in each of said transfer section and said processing section.

12. The substrate processing system as set forth in claim 11,
wherein a cleaning unit for cleaning the substrate is provided in said transfer section.

13. The substrate processing system as set forth in claim 11,
wherein the heating processing after the exposure processing for a last time is performed in said heating processing unit in said processing section, and
wherein the heating processing after the exposure processing other than the exposure processing for the last time is performed in said heating processing unit in said transfer section.

14. The substrate processing system set forth in claim 6, wherein the aligner includes a wafer transfer unit movable on a linear transfer path extending in a direction parallel to the end of the aligner to which the first processing system is connected.

* * * * *